United States Patent
Kwon et al.

(10) Patent No.: US 8,373,434 B2
(45) Date of Patent: Feb. 12, 2013

(54) CONTROL BOARD FOR CONNECTION BETWEEN FPGA BOARDS AND TEST DEVICE THEREOF

(75) Inventors: Young Cheol Kwon, Hwaseong-si (KR); Sun-il Roe, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 13/097,306

(22) Filed: Apr. 29, 2011

(65) Prior Publication Data

US 2011/0304352 A1 Dec. 15, 2011

(30) Foreign Application Priority Data

Jun. 14, 2010 (KR) .......................... 10-2010-0056209

(51) Int. Cl.
*H03K 19/00* (2006.01)
(52) U.S. Cl. ............. 326/16; 326/41; 326/101; 326/113
(58) Field of Classification Search .................... 326/16, 326/41, 101, 113; 361/748, 783, 784, 791, 361/832, 837
See application file for complete search history.

(56) References Cited

U.S. PATENT DOCUMENTS

| | | | | |
|---|---|---|---|---|
| 5,539,331 A | * | 7/1996 | Hatori et al. | 326/41 |
| 5,872,716 A | * | 2/1999 | Yano et al. | 257/203 |
| 6,078,068 A | * | 6/2000 | Tamura | 257/203 |
| 6,829,750 B2 | * | 12/2004 | Maki et al. | 326/113 |
| 2008/0097717 A1 | | 4/2008 | Tokunaga et al. | |

FOREIGN PATENT DOCUMENTS

| JP | 2008145266 A | 6/2008 |
|---|---|---|
| WO | WO-2008152697 A1 | 12/2008 |

* cited by examiner

*Primary Examiner* — Vibol Tan
(74) *Attorney, Agent, or Firm* — Harness, Dickey & Pierce, P.L.C.

(57) ABSTRACT

A Field Programmable Gate Arrays (FPGA) connection control board is provided. The FPGA connection control board includes a printed circuit board (PCB), a plurality of first connection terminals formed at an upper part of the PCB, a plurality of second connection terminals formed at a lower part of the PCB and a plurality of switches each for selectively connecting each of the plurality of first connection terminals with each of the plurality of second connection terminals.

16 Claims, 5 Drawing Sheets

CONTROL BOARD FOR CONNECTION BETWEEN FPGA BOARDS AND TEST DEVICE THEREOF

CROSS-REFERENCE TO RELATED APPLICATIONS

This application claims priority under 35 U.S.C. §119 to Korean Patent Application No. 10-2010-0056209 filed on Jun. 14, 2010, in the Korean Intellectual Property Office (KIPO), the disclosure of which is hereby incorporated by reference in its entirety.

BACKGROUND

1. Field

Example embodiments of the inventive concepts relate to a Field Programmable Gate Arrays (FPGA) test device, and more particularly, to a FPGA connection control board. Example embodiments also relate to a system having the FPGA connection control board. Example embodiments also relate to controlling connections between pluralities of connection terminals embodied in two FPGA boards and a FPGA test device.

2. Description of the Related Art

Generally, when developing and manufacturing a semiconductor product, a Field Programmable Gate Arrays (FPGA) device is used to verify functions of the semiconductor product before manufacturing. Since capacity of a single FPGA is small compared with an increasing speed of integration of a semiconductor device, it is common to use a structure having several FPGA boards. However, FPGA becomes greatly declined in its application since each connector of accumulated FPGA boards is connected to each other according to a conventional method.

SUMMARY

The inventive concepts provide a FPGA connection control board which may aid in efficiently designing FPGA. The inventive concepts may also provide for a simple Device Under Test (DUT) by controlling connections between connection terminals of different Field Programmable Gate Arrays (FPGA) boards. The inventive concepts also provide a system having a FPGA connection control board and a test device using the same.

An example embodiment of the invention is directed to a connection control board for field programmable gate arrays (FPGA). In example embodiments, the connection control board includes a printed circuit board (PCB), a plurality of first connection terminals formed at an upper side of the PCB, a plurality of second connection terminals formed at a lower side of the PCB, and a plurality of switches connecting the plurality of first connection terminals to the plurality of second connection terminals. In this example embodiment, the plurality of switches may be formed at an upper part of the PCB or inside the PCB.

A first switch group among the plurality of switches may be switched in response to a first switch control signal, and a second switch group among the plurality of switches may be switched in response to a second switch control signal.

Another example embodiment of the invention is directed to a FPGA test device, including a FPGA connection control board connected between a first FPGA board and a second FPGA board. The FPGA connection control board includes a PCB, a plurality of first connection terminals at an upper part of the PCB and connected to connection terminals of the first FPGA board, a plurality of second connection terminals at a lower part of the PCB and connected to connection terminals of the second FPGA board, and a plurality of switches each for connecting each of the plurality of first connection terminals with each of the plurality of second connection terminals. In this example embodiment, the plurality of switches may be formed at an upper part of the PCB or inside the PCB.

A first switch group of the plurality of switches may be switched in response to a first switch control signal and a second switch group of the plurality of switches may be switched in response to a second switch control signal.

Another example embodiment of the invention provides a system that includes a Field Programmable Gate Arrays (FPGA) connection control board. In this example, embodiment, the Field Programmable Gate Arrays (FPGA) connection control board includes a plurality of first connection terminals on an upper part of a printed circuit board, a plurality of second connection terminals on a lower part of the printed circuit board, a plurality of switch circuits electrically connecting the plurality of first connection terminals to the plurality of second connection terminals, and a switch controller configured to control the plurality of switch circuits.

BRIEF DESCRIPTION OF THE DRAWINGS

These and/or other aspects and advantages of the inventive, concepts will become apparent and more readily appreciated from the following description of the example embodiments, taken in conjunction with the accompanying drawings of which.

DETAILED DESCRIPTION OF THE EXAMPLE EMBODIMENTS

Figure 1:
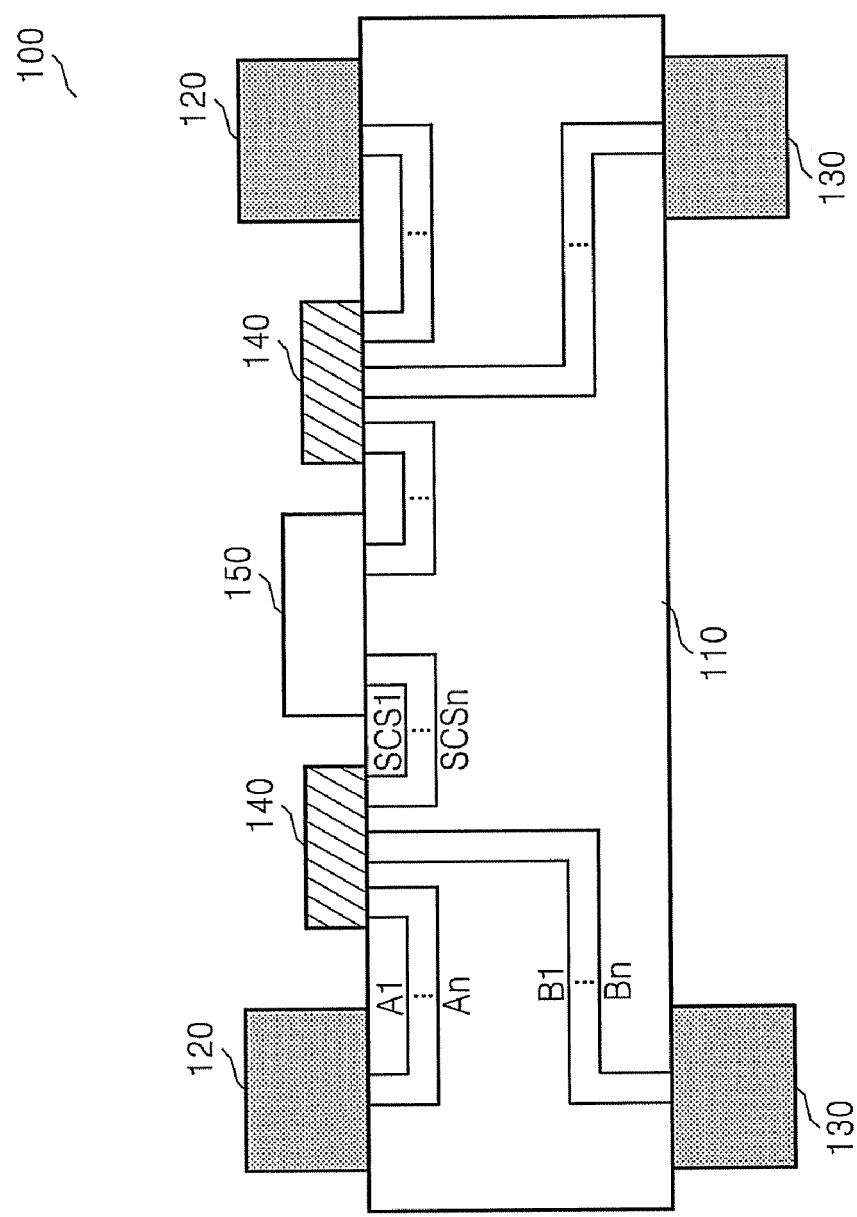
FIG. 1 shows a sectional diagram of a Field Programmable Gate Arrays (FPGA) connection control board according to an example embodiment of the invention.

Example embodiments of the invention will now be described more fully hereinafter with reference to the accompanying drawings, in which example embodiments of the invention are shown. This invention may, however, be embodied in many different forms and should not be construed as limited to the example embodiments set forth herein. Rather, the example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular example embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Reference will now be made in detail to the example embodiments of the invention, examples of which are illustrated in the accompanying drawings, wherein like reference numerals refer to the like elements throughout. The example embodiments are described below in order to explain the inventive concepts by referring to the figures.

Figure 2:
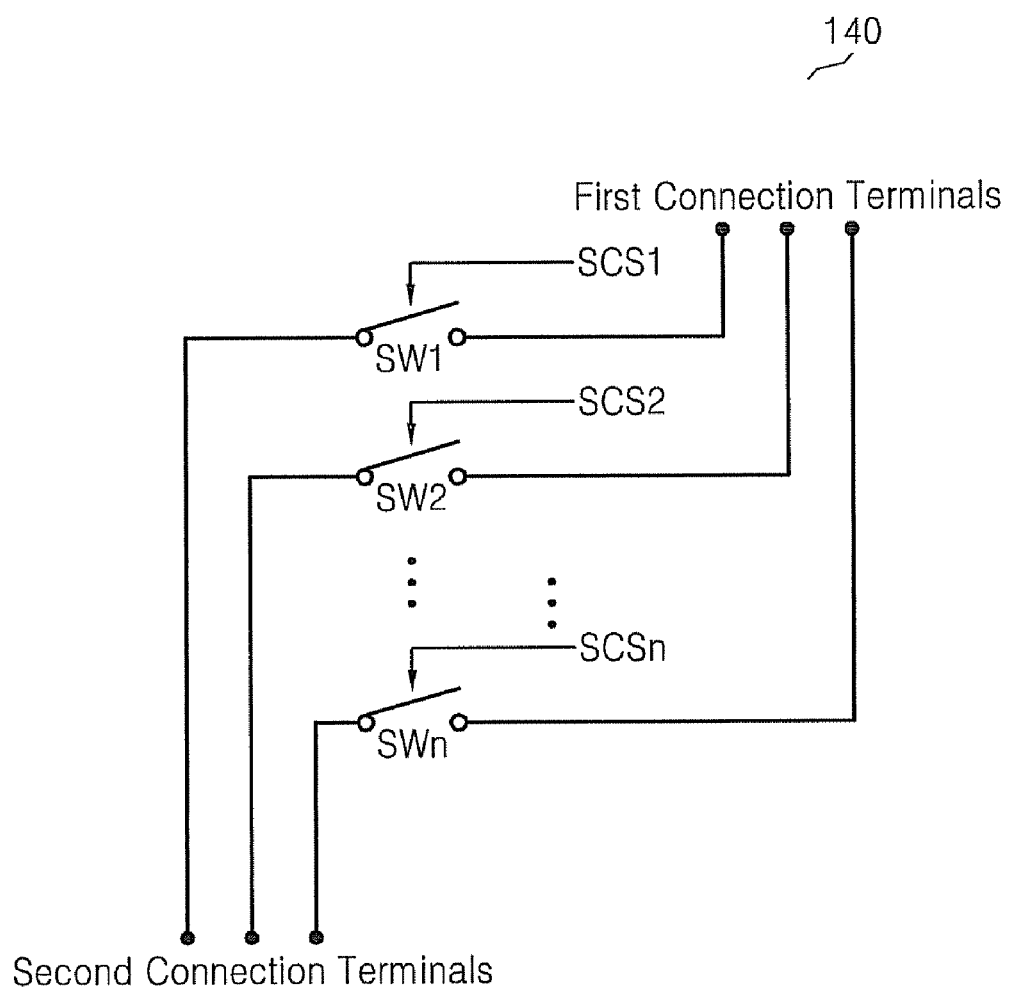
FIG. 2 shows an example embodiment of a switch circuit illustrated in FIG. 1.

FIG. 1 shows a Field Programmable Gate Arrays (FPGA) connection control board according to an example embodiment of the invention, and FIG. 2 shows an example embodiment of a switch circuit illustrated in FIG. 1. Referring to FIGS. 1 and 2, a FPGA connection control board 100 includes a substrate 110 like a printed circuit board (PCB), a plurality of first connection terminals 120, a plurality of second connection terminals 130, a switch circuit 140, and a switch controller 150.

A PCB 110 includes a plurality of wirings A1, A2, ..., An and B1, B2 ..., Bn for connecting each of a plurality of first connection terminals 120 with each of a plurality of second connection terminals 130 through a switch circuit 140. Additionally, the PBC 110 includes wirings or circuit patterns for transmitting a plurality of switch control signals SCS1, SCS2, ..., SCSn output from a switch controller 150 to the switch circuit 140.

The plurality of first connection terminals 120 are fanned at an upper part of the PCB 110 and may be connected to terminals of an external device, e.g., a first FPGA board. According to example embodiments, the plurality of first connection terminals 120 may be embodied in a connector.

The plurality of second connection terminals 130 are formed at a lower part of the PCB 110 and may be connected to terminals of another external device, e.g., a second FPGA board. According to example embodiments, the plurality of second connection terminals 130 may be embodied in a connector.

The switch circuit 140 is formed at an upper part of the PCB 110 and includes a plurality of switches SW1, SW2, ..., SWn, and each of the plurality of switches SW1, SW2, ..., SWn is connected between each of the plurality of first connection terminals 120 and each of the plurality of second connection terminals 120.

According to this example embodiment, each of the plurality of switches SW1, SW2, ..., SWn may be embodied in an element which may perform a switching function in response to a control signal such as metal-oxide-semiconductor field-effect transistor (MOSFET) or bipolar (junction) transistor (BJT).

A switch controller 150 may control on/off of each of the plurality of switches SW1, SW2, ..., SWn by supplying each of a plurality of switch control signals SCS1, SCS2, ..., SCSn to each of the plurality of switches SW1, SW2, ..., SWn.

According to example embodiments, a switch controller 150 may include a plurality of switches operated manually or by mechanical handling. Moreover, the switch controller 150 may be embodied in a hardware having a software or a hardware which may generate a plurality of switch control signals SCS1, SCS2, ..., SCSn in response to a plurality of control signals input from outside.

Figure 3:
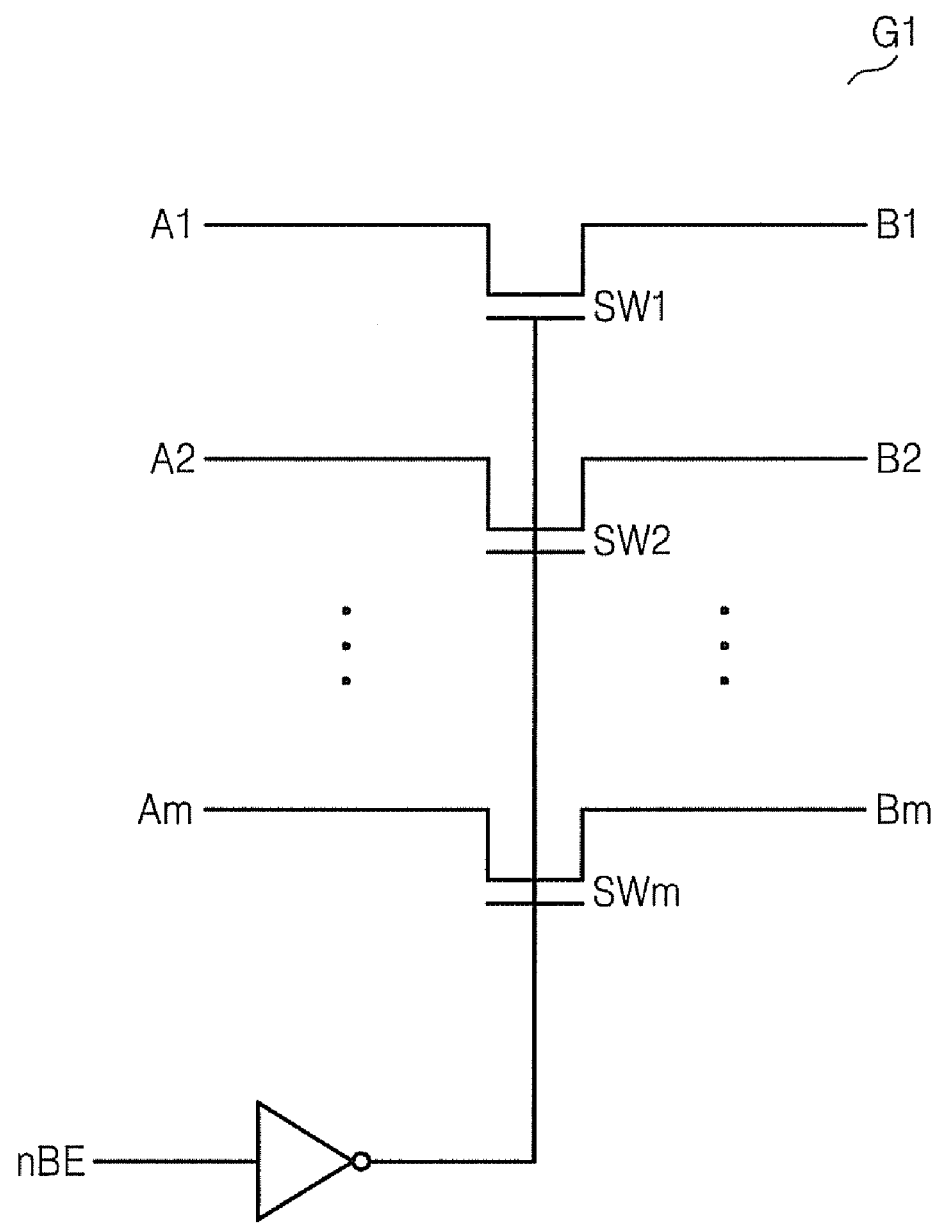
FIG. 3 shows a switch group embodied in the switch circuit illustrated in FIG. 1.

FIG. 3 shows a switch group embodied in a switch circuit illustrated in FIG. 1.

Referring to FIGS. 1 to 3, each of the plurality of switches SW1, SW2, ..., SWn as illustrated in FIG. 2 performs a switching operation in response to each of the plurality of switch control signals SCS1, SCS2, ..., SCSn. However, at least two switches SW1 to SWm, where m is a natural number, may perform a switching operation at the same time in response to a switch control signal nBE. A switch control signal nBE corresponds to one of the plurality of switch control signals SCS1, SCS2, ..., SCSn.

A switch group G1 as illustrated in FIG. 3 includes a plurality of switches among the plurality of switches SW1, SW2, ..., SWn embodied in the switch circuit 140. That is n is greater than m.

Accordingly, the switch circuit 140 includes a plurality of switch groups including the switch group G1, and each of the plurality of switch groups includes a plurality of switches. Each of the plurality of switch groups performs a switching operation at the same time in response to a corresponding switch control signal.

For example, the switch group G1 includes a plurality of switches SW1, SW2, ..., SWm each embodied in MOSFET. Each of the plurality of switches SW1, SW2, ..., SWm of the switch group G1 may control a switching operation of each of a plurality of first connection terminals A1, A2, ..., Am and second connection terminals B1, B2, ..., Bm in response to a switch control signal nBE from the switch controller 150.

In other words, the switch circuit 140 and the switch controller 150 using a concept of the switch group G1 according to an example embodiment of the invention may control all switches SW1, SW2, ..., SWm of the switch group G1 at the same time according to a switch control signal nBE, so that they may control effectively FPGA boards by bank.

Figure 4:
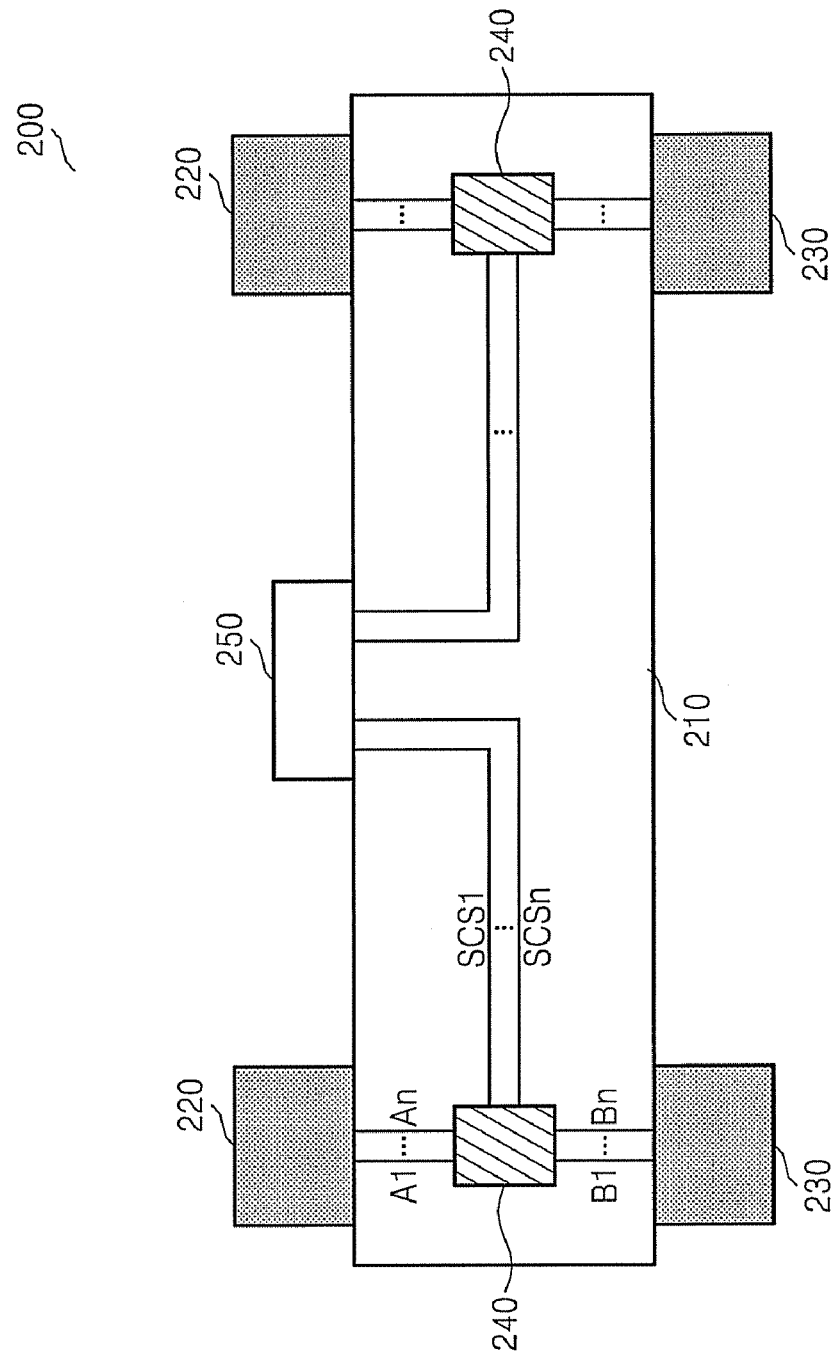
FIG. 4 shows a FPGA connection control board according to another example embodiment of the invention.

FIG. 4 shows a FPGA connection control board according to another example embodiment of the invention. Referring to FIGS. 2 to 4, a FPGA connection control board 200 includes a substrate like a PCB 210, a plurality of first connection terminals 220, a plurality of second connection terminals 230, a switch circuit 240 and a switch controller 250.

In the PCB 210, a plurality of wirings A1, A2, ..., An and B1, B2, ..., Bn for connecting each of the plurality of first connection terminals 220 with each of the plurality of second connection terminals 230 are embodied, and a plurality of wirings for transmitting a plurality of switch control signals SCS1, SCS2, ..., SCSn output from the switch controller 250 to a switch circuit 240 are embodied. The plurality of first connection terminals 220 formed at an upper part of the PCB 210 may be connected to terminals of an external device, e.g., a first FPGA board. The plurality of second connection terminals 230 formed at a lower part of the PCB 210 may be connected to terminals of another external device, e.g., a second FPGA board.

The switch circuit 240 formed inside the PCB 210 includes a plurality of switches, and each of the plurality of switches is connected between each of the plurality of first connection terminals 220 and each of the plurality of second connection terminals 230.

Each of the plurality of switch control signals SCS1, SCS2, . . . , SCSn output from the switch controller 250 may control on/off of each of the plurality of switches.

As explained referring to FIG. 3, the switch circuit 240 includes a plurality of switch groups, and each of the plurality of switch groups includes a plurality of switches. Each of the plurality of switch groups may perform a switching operation at the same time in response to each of the plurality of switch control signals SCS1, SCS2, . . . , SCSn. Accordingly, a switch control signal may control a switching operation of at least one switch embodied in the switch circuit 240.

A structure of a FPGA connection control board 100 illustrated in FIG. 4 is substantially equal or similar to one of the FPGA connection control board 100 illustrated in FIG. 1 except that the switch circuit 240 is formed in the PCB 210, so detailed explanation of the FPGA connection control board 200 is omitted here.

Figure 5:
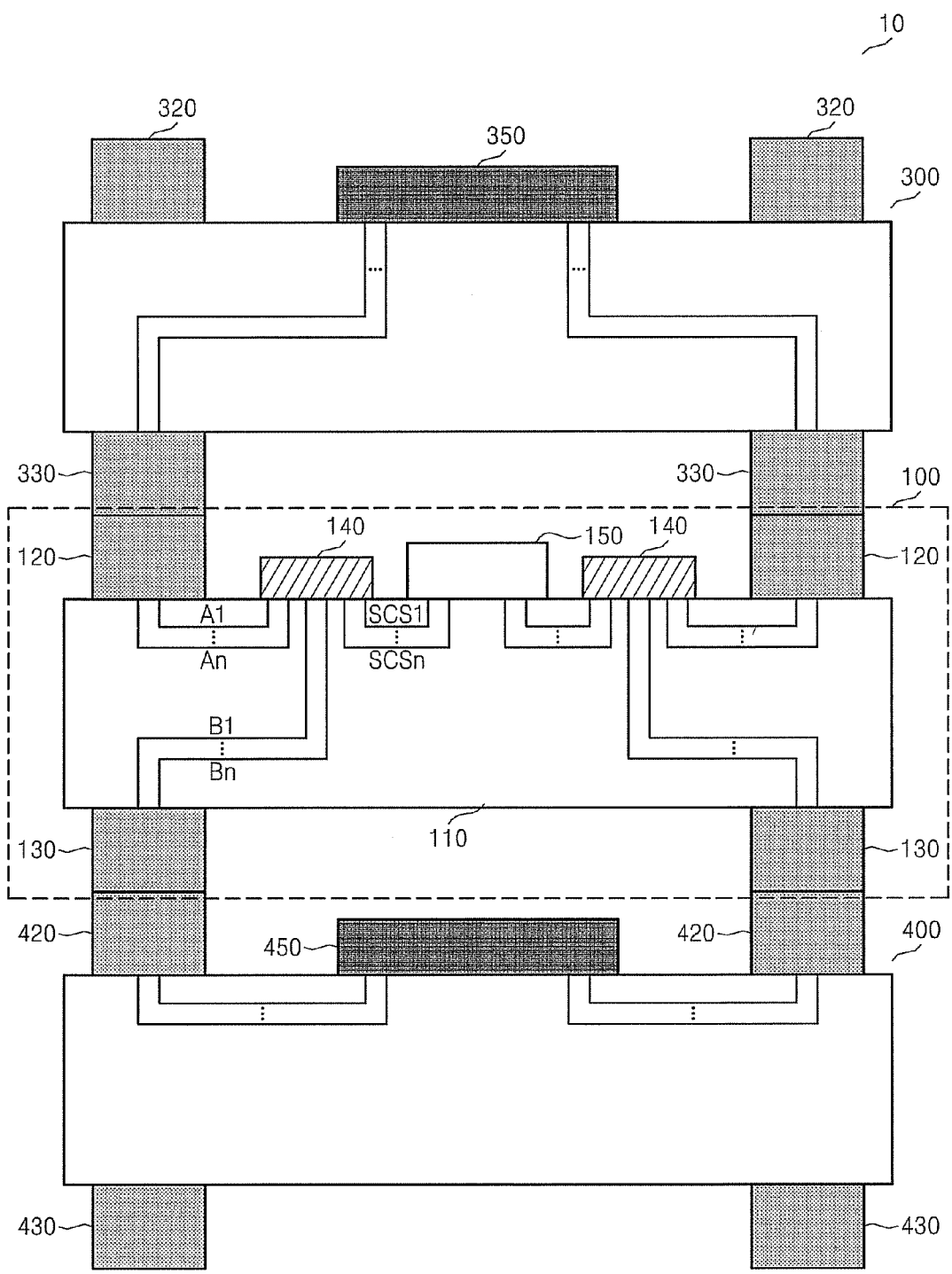
FIG. 5 shows a FPGA test device including a FPGA connection control board according to an example embodiment of the invention.

FIG. 5 displays a FPGA test device including a FPGA connection control board according to an example embodiment of the invention. Referring to FIGS. 1 to 5, a FPGA test device 10 includes a first FPGA board 300, a FPGA connection control board 100 and a second FPGA board 400. The first FPGA board 300 includes a plurality of upper connection terminals 320, a plurality of lower connection terminals 330 and a first FPGA 350. The first FPGA 350 is connected to the plurality of lower connection terminals 330 electrically.

A second FPGA board 400 includes a plurality of upper connection terminals 420, a plurality of lower connection terminals 430 and a second FPGA 450. The second FPGA 450 is connected to the plurality of upper connection terminals 420 electrically. The FPGA connection control board 100 includes a substrate like a PCB 110, a plurality of first connection terminals 120, a plurality of second connection terminals 130, a switch circuit 140 and a switch controller 150.

The FPGA connection control board 100 performs a function connecting a first FPGA board 300 with a second FPGA board 400 electrically.

The plurality of lower connection terminals 330 of the first FPGA board 300 are connected to the plurality of first connection terminals 120 of the FPGA connection control board 100 electrically, and the plurality of second connection terminals 130 of the FPGA connection control board 100 are connected to the plurality of upper connection terminals 420 of the second FPGA board 400 electrically.

At least one signal selected by the switch circuit 140 of the FPGA connection control board 100 among signals output from the first FPGA 350 may be transmitted to the second FPGA 450.

That is, the switch circuit 140 of the FPGA connection control board 100 may not connect all pins of the first FPGA 350 with all pins of the second FPGA 450 electrically, but may connect some pins of the first FPGA 350 with some pins of the second FPGA 450 in response to at least one switching control signal output from the switch controller 150. Here, a pin means a wiring or a circuit pattern transmitting an electrical signal.

Accordingly, the FPGA connection control board 100 may perform an efficient designing of FPGA and a simple device under test (DUT) by controlling connection between the plurality of lower connection terminals 330 of the first FPGA board 300 and the plurality of upper connection terminals 420 of the second FPGA board 400 selectively.

A field programmable gate arrays (FPGA) connection control board according to example embodiments of the invention and a system using the same may control connection between connectors of FPGA boards, so it may aid in design and verification of FPGA efficiently.

Although a few example embodiments of the inventive concepts have been shown and described, it will be appreciated by those skilled in the art that changes may be made in these example embodiments without departing from the principles and spirit of the inventive concepts, the scope of which is defined in the appended claims and their equivalents.

What is claimed is:

1. A connection control board for Field Programmable Gate Arrays (FPGA), the connection control board comprising:
    a printed circuit board;
    a plurality of first connection terminals on an upper part of the printed circuit board;
    a plurality of second connection terminals on a lower part of the printed circuit board; and
    a plurality of switches selectively connecting the plurality of first connection terminals to the plurality of second connection terminals, wherein
    a first switch group among the plurality of switches is configured to switch in response to a first switch control signal, and
    a second switch group among the plurality of switches is configured to switch in response to a second switch control signal.

2. The connection control board of claim 1, wherein the plurality of switches are on the upper part of the printed circuit board.

3. The connection control board of claim 1, wherein the plurality of switches are inside the printed circuit board.

4. A test device for field programmable gate arrays (FPGA), the test device comprising:
    the connection control board of claim 1 connected between a first FPGA board and a second FPGA board, wherein
    the plurality of first connection terminals are connected to connection terminals of the first FPGA board, and the plurality of second connection terminals are connected to connection terminals of the second FPGA board.

5. The test device of claim 4, wherein the plurality of switches are on the upper part of the printed circuit board.

6. The test device of claim 4, wherein the plurality of switches are inside the printed circuit board.

7. A system comprising:
    the connection control board of claim 1; and
    a switch controller configured to control the plurality of switch circuits, the switch controller configured to generate the first switch control signal and the second switch control signal.

8. The system of claim 7, wherein the plurality of switch circuits are on the upper part of the printed circuit board.

9. The system of claim 7, wherein the plurality of switch circuits are in the printed circuit board.

10. A system comprising:
a connection control board for Field Programmable Arrays (FPGA), the connection control board including,
- a plurality of first connection terminals on an upper part of a printed circuit board,
- a plurality of second connection terminals on a lower part of the printed circuit board, and
- a plurality of switch circuits selectively connecting the plurality of first connection terminals to the plurality of second connection terminals; and
- a switch controller configured to control the plurality of switch circuits, wherein the connection control board further includes,
- first wirings connecting the plurality of first connection terminals to the plurality of switch circuits,
- second wirings connecting the plurality of second connection terminals to the plurality of switch circuits; and
- third wirings connecting the switch controller to the plurality of switch circuits, the third wirings configured to carry control signals from the switch controller to the plurality of switch circuits to control the plurality of switch circuits.

11. The system of claim 10, wherein each switch circuit includes a plurality of switches configured to receive a plurality of switch control signals from the switch controller.

12. A system comprising:
a connection control board for Field Programmable Arrays (FPGA), the connection control board including,
- a plurality of first connection terminals on an upper part of a printed circuit board,
- a plurality of second connection terminals on a lower part of the printed circuit board, and
- a plurality of switch circuits selectively connecting the plurality of first connection terminals to the plurality of second connection terminals; and
- a switch controller configured to control the plurality of switch circuits, wherein at least one of the plurality of switch circuits includes n number of switches, the n number of switches including a switch group having m number of switches, the switch group being configured to receive a same control signal such that the switches of the switch group perform a switching operation at a same time in response to the same control signal and n is greater than or equal to m.

13. The system of claim 12, wherein the switch group includes a plurality of switches embodied in MOSFET.

14. A system comprising:
a connection control board for Field Programmable Arrays (FPGA), the connection control board including,
- a plurality of first connection terminals on an upper part of a printed circuit board,
- a plurality of second connection terminals on a lower part of the printed circuit board, and
- a plurality of switch circuits selectively connecting the plurality of first connection terminals to the plurality of second connection terminals;
a switch controller configured to control the plurality of switch circuits;
a first FPGA board connected to the plurality of first connection terminals; and
a second FPGA board connected to the plurality of second connection terminals,
wherein a first switch group among the plurality of switch circuits is configured to switch in response to a first switch control signal, and
a second switch group among the plurality of switch circuits is configured to switch in response to a second switch control signal.

15. The system of claim 14, wherein the switch controller is configured to be operated manually.

16. The system of claim 14, wherein the switch controller is configured to generate a plurality of switch control signals in response to a plurality of externally received control signals.

* * * * *